US010706231B2

(12) United States Patent
Kamata et al.

(10) Patent No.: US 10,706,231 B2
(45) Date of Patent: Jul. 7, 2020

(54) INPUT APPARATUS AND INFORMATION PROCESSING APPARATUS (71) Applicant: SONY CORPORATION, Tokyo (JP)

(72) Inventors: Toshiaki Kamata, Kanagawa (JP); Munetake Ebihara, Tokyo (JP); Hideyoshi Wakimoto, Tokyo (JP); Akira Fujisawa, Tokyo (JP); Ichirou Higuchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 113 days.

(21) Appl. No.: 15/551,809

(22) PCT Filed: Jan. 21, 2016

(86) PCT No.: PCT/JP2016/000295
§ 371 (c)(1),
(2) Date: Aug. 17, 2017

(87) PCT Pub. No.: WO2016/139881
PCT Pub. Date: Sep. 9, 2016

(65) Prior Publication Data
US 2018/0032501 A1 Feb. 1, 2018

(30) Foreign Application Priority Data
Mar. 4, 2015 (JP) .................................. 2015-042721

(51) Int. Cl.
G06F 3/048 (2013.01)
G06F 40/274 (2020.01)
(Continued)

(52) U.S. Cl.
CPC .......... G06F 40/274 (2020.01); G06F 3/0202 (2013.01); G06F 3/023 (2013.01);
(Continued)

(58) Field of Classification Search
CPC ............ H01H 2239/006; H01H 13/702; G06F 3/0202; G06F 3/04883; G06F 3/016
See application file for complete search history.

(56) References Cited

U.S. PATENT DOCUMENTS 10,120,506 B2 * 11/2018 Chen ........................ G06F 3/044
2002/0025837 A1 * 2/2002 Levy ..................... G06F 3/0235
455/566

(Continued)

FOREIGN PATENT DOCUMENTS

| JP | 2005-108036 A | 4/2005 |
| JP | 2012-146267 A | 8/2012 |
| JP | 2013-175149 A | 9/2013 |

OTHER PUBLICATIONS

International Search Report and Written Opinion of PCT Application No. PCT/JP2016/000295, dated Feb. 23, 2016, 01 pages of English Translation and 05 pages of ISRWO.

*Primary Examiner* — Nicholas Augustine
(74) *Attorney, Agent, or Firm* — Chip Law Group (57) ABSTRACT

Provided is an input apparatus that can reduce incorrect inputs and improve the operability. The input apparatus according to an embodiment of the present technology includes a keyboard module and a control circuit. The keyboard module has a plurality of key areas, and a plurality of sensor devices capable of detecting pressures of keystroke operations for the plurality of key areas, respectively. The control circuit that makes a difference between input sensitivity to the keystroke operation of one key area and input sensitivity to the keystroke operation of a key area next to the one key area on the basis of a pressure information item about each of the key areas next to each other, the pressure information item being detected by the keystroke operation on the plurality of sensor devices at the same time.

8 Claims, 10 Drawing Sheets

(51) Int. Cl.
- *G06F 3/023* (2006.01)
- *H03K 17/96* (2006.01)
- *G06F 3/02* (2006.01)
- *G06F 3/044* (2006.01)
- *G06F 3/041* (2006.01)
- *G06F 3/0488* (2013.01)
- *G06F 3/00* (2006.01)

(52) U.S. Cl.
CPC ............ *G06F 3/044* (2013.01); *G06F 3/0414* (2013.01); *G06F 3/04886* (2013.01); *H03K 17/9622* (2013.01)

(56) References Cited

U.S. PATENT DOCUMENTS

| | | | |
|---|---|---|---|
| 2006/0119581 A1* | 6/2006 | Levy | G06F 3/0219 345/168 |
| 2011/0050628 A1* | 3/2011 | Homma | G06F 3/0236 345/174 |
| 2015/0100910 A1* | 4/2015 | Luo | G06F 3/04883 715/771 |
| 2015/0130742 A1* | 5/2015 | Chen | G06F 3/044 345/174 |
| 2015/0143276 A1* | 5/2015 | Luo | G06F 1/1626 715/773 |

* cited by examiner

INPUT APPARATUS AND INFORMATION PROCESSING APPARATUS

CROSS REFERENCE TO RELATED APPLICATIONS

This application is a U.S. National Phase of International Patent Application No. PCT/JP2016/000295 filed on Jan. 21, 2016, which claims priority benefit of Japanese Patent Application No. JP 2015-042721 filed in the Japan Patent Office on Mar. 4, 2015. Each of the above-referenced applications is hereby incorporated herein by reference in its entirety.

TECHNICAL FIELD

The present technology relates to an input apparatus capable of detecting a keystroke operation on the basis of pressure applied to each key area, and an information processing apparatus including the same.

BACKGROUND ART

As an input apparatus capable of electrostatically detecting an input operation, there is known an input apparatus with which key inputs can be performed by typing a keyboard displayed on a display. For example, Patent Literature 1 discloses an input device that displays a GUI component such as a software keyboard on a typing panel having a function of a display device, where displayed keys are typed to thereby inputting the keys.

CITATION LIST

Patent Literature

Patent Literature 1: Japanese Patent Application Laid-open No. 2012-146267

DISCLOSURE OF INVENTION

Technical Problem

In a keyboard using an electrostatic capacitance sensor as a sensor for detecting a keystroke operation by the user, it is determined whether or not an effective keystroke operation is performed by whether or not an amount of change from an initial value of an electrostatic capacitance exceeds a predetermined threshold value when the keystroke operation is performed.

However, there are problems that in a case where the operation surface is flat, it is difficult to find the positions of the keys, and in a case where the input position is inadequate such as the position between two keys next to each other, a weak keystroke is detected, and no key inputs are performed. On the other hand, in a case where typing is strong, the keys next to each other are detected at the same time, and unwanted characters may be input.

In view of the above-mentioned circumstances, an object of the present technology is to provide an input apparatus that can reduce incorrect inputs and improve operability and an information processing apparatus including the same.

Solution to Problem

An input apparatus according to an embodiment of the present technology includes a keyboard module and a control circuit.

The keyboard module has a plurality of key areas, and a plurality of sensor devices capable of detecting pressures of keystroke operations for the plurality of key areas, respectively.

The control circuit is configured to make a difference between input sensitivity to the keystroke operation of one key area and input sensitivity to the keystroke operation of a key area next to the one key area on the basis of a pressure information item about each of the key areas next to each other, the pressure information item being detected by the keystroke operation on the plurality of sensor devices at the same time.

Since the input apparatus includes the control circuit that makes a difference between input sensitivity to the keystroke operation of one key area and input sensitivity to the keystroke operation of a key area next to the one key area, it is possible to facilitate the key inputs and preferentially input the keys having high probabilities that match the user's intention. With this configuration, it is possible to reduce the incorrect inputs and improve the operability.

The control circuit may be configured to make the input sensitivity of one key area having the largest pressure detected among the key areas next to each other higher than the input sensitivity of the other.

With the above-described configuration, since the key having the highest operation pressure is input in preference to other keys, it may avoid inputting of unwanted characters even if the keys next to each other are pressed by mistake.

The input apparatus may further include a memory unit that stores a plurality of key information items that represent a plurality of text strings and an input history of the keystroke operation. In this case, the control circuit may be configured to make a difference between the input sensitivity to the keystroke operation of one key area and the input sensitivity to the keystroke operation of the key area next to the one key area on the basis of the pressure information item about each of the key areas next to each other, the plurality of key information items, and the input history.

With the above-described configuration, since it is possible to predict the text string that the user tries to input, even if the keys next to each other are pressed by mistake at the same time during the operation, it is possible to preferentially input the keys having high probabilities that match the user's intention.

Alternatively, the input apparatus further includes a memory unit that stores the input history of the keystroke operation, and the control circuit may be configured to make a difference between the input sensitivity to the keystroke operation of one key area and the input sensitivity to the keystroke operation of the key area next to the one key area on the basis of the pressure information item about each of the key areas next to each other and the input history.

With the above-described configuration, as the key frequently used is input preferentially to the other key, it may avoid inputting of unwanted characters even if the keys next to each other are pressed at the same time by mistake.

The plurality of sensor devices may be a plurality of capacitance sensors that detect the pressure of the keystroke operation as a change of capacitance.

In this case, the input sensitivity may be a threshold value of an amount of capacity change set for each of the plurality of capacitance sensors. But it is not limited thereto, the input sensitivity may be a signal gain that sets a pressure information item of each key area output from the keyboard module for each key area.

An information processing apparatus according to an embodiment of the present technology includes a keyboard module, a control circuit, and a display unit.

The keyboard module has a plurality of key areas, and a plurality of sensor devices capable of detecting pressures of keystroke operations for the plurality of key areas, respectively.

The control circuit is configured to make a difference between input sensitivity to the keystroke operation of one key area and input sensitivity to the keystroke operation of a key area next to the one key area on the basis of a pressure information item about each of the key areas next to each other, the pressure information item being detected by the keystroke operation on the plurality of sensor devices at the same time.

The display unit is configured to be capable of displaying an image corresponding to the keystroke operation on the basis of an output from the control circuit.

Since the information processing apparatus includes the control circuit that makes a difference between input sensitivity to the keystroke operation of one key area and input sensitivity to the keystroke operation of a key area next to the one key area, it is possible to facilitate the key inputs and preferentially input the keys having high probabilities that match the user's intention. With this configuration, it is possible to reduce the incorrect inputs and improve the operability.

Advantageous Effects of Invention

As described above, according to the present technology, it is possible to improve the operability.

It should be noted that the effects described here are not necessarily limitative and may be any of effects described in the present disclosure.

MODE(S) FOR CARRYING OUT THE INVENTION

Hereinafter, embodiments of the present technology will be described with reference to the drawings.

First Embodiment

[Input Apparatus]

Figure 1:
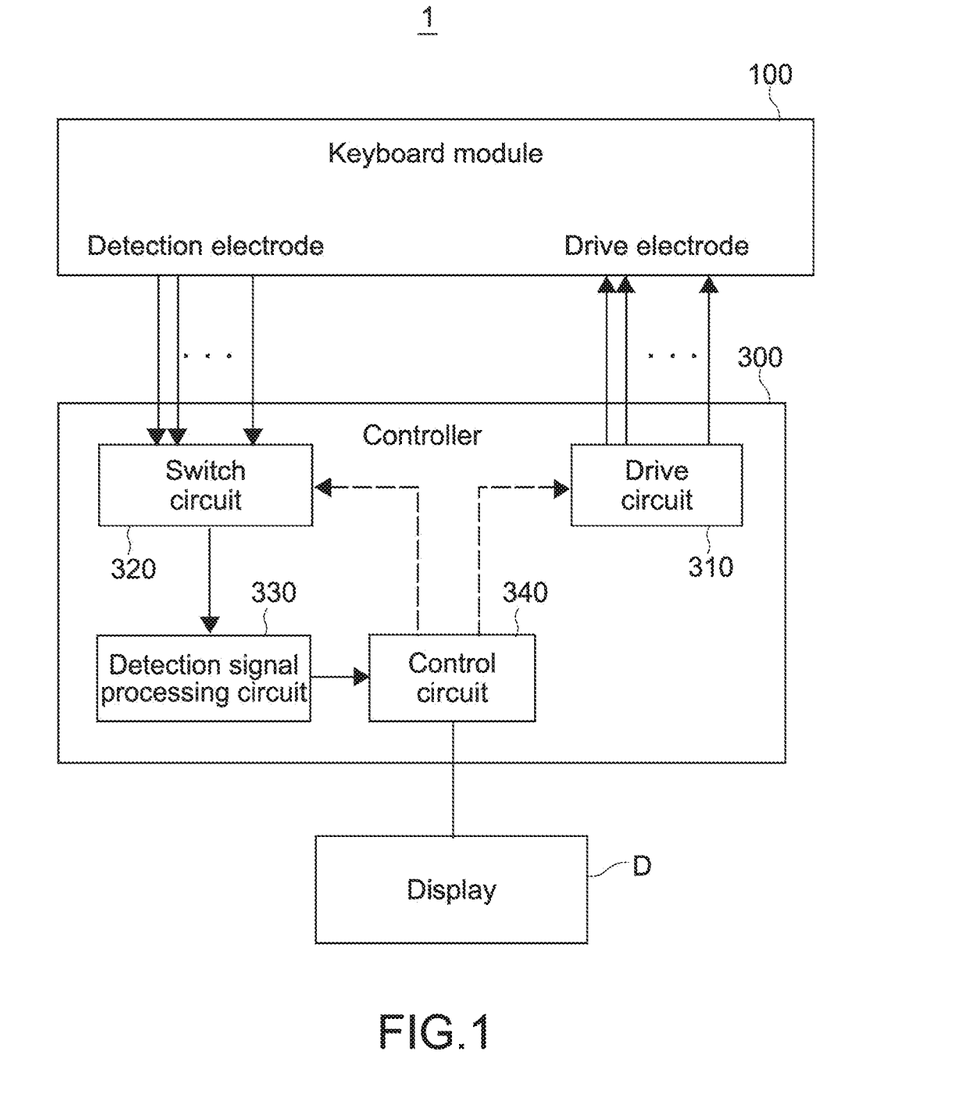
FIG. 1 is a block diagram showing a configuration of an input apparatus according to a first embodiment of the present technology.

FIG. 1 is a block diagram showing a configuration of an input apparatus according to a first embodiment of the present technology.

An input apparatus 1 of this embodiment includes a keyboard module 100 and a controller 300.

The input apparatus 1 is configured to be electrically connectable to a display unit D. The input apparatus 1 and the display unit D constitute an information processing apparatus of a slate type, a desktop type, or a note type. The display unit D is typically constituted of a liquid crystal display, an organic EL display, or the like, and may have a touch panel function on its display surface.

(Keyboard Module)

The keyboard module 100 has a plurality of key areas (reference sign 10a of FIG. 3) that are operation areas for each key. The keyboard module 100 has a plurality of sensor devices that detect pressures applied on the key areas by a user over the plurality of key areas 10a, when the user performs a keystroke operation on any key areas 10a by the finger or the like.

Note that, in this specification, a "keystroke operation" typically means that one key is pressed, and "typing" means that a plurality of keys are stroked consecutively.

In this embodiment, the plurality of sensor devices are a plurality of capacitance sensors where capacitance changes consecutively in response to an amount of displacement of the key area 10a in the Z axis direction generated by the pressure applied by the user. The plurality of capacitance sensors are arranged for each key area or arranged corresponding to each key.

Figure 2:
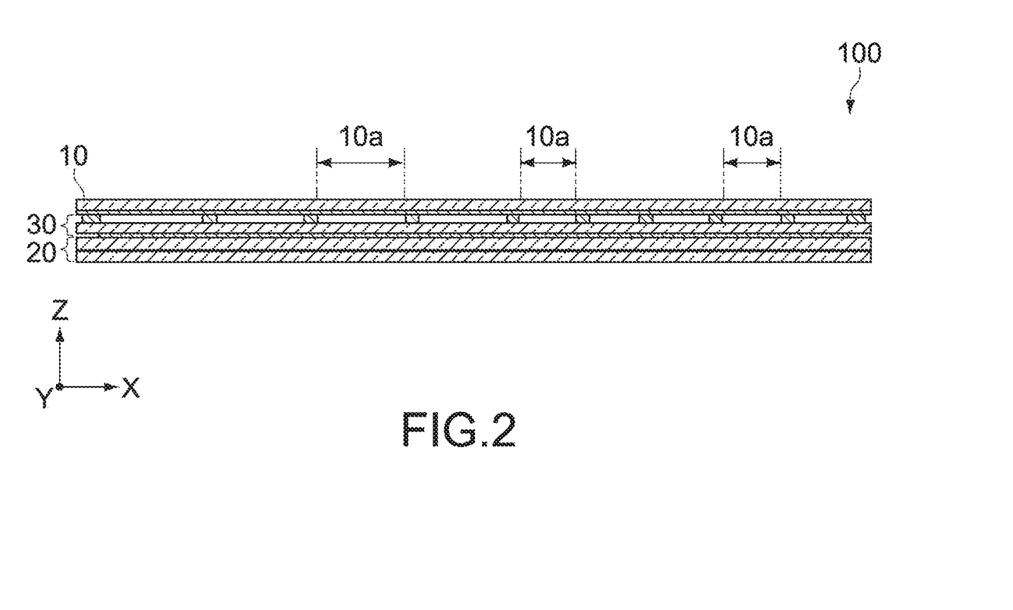
FIG. 2 is a schematic cross-sectional view showing a main part of a keyboard module of the keyboard module.
Figure 3:
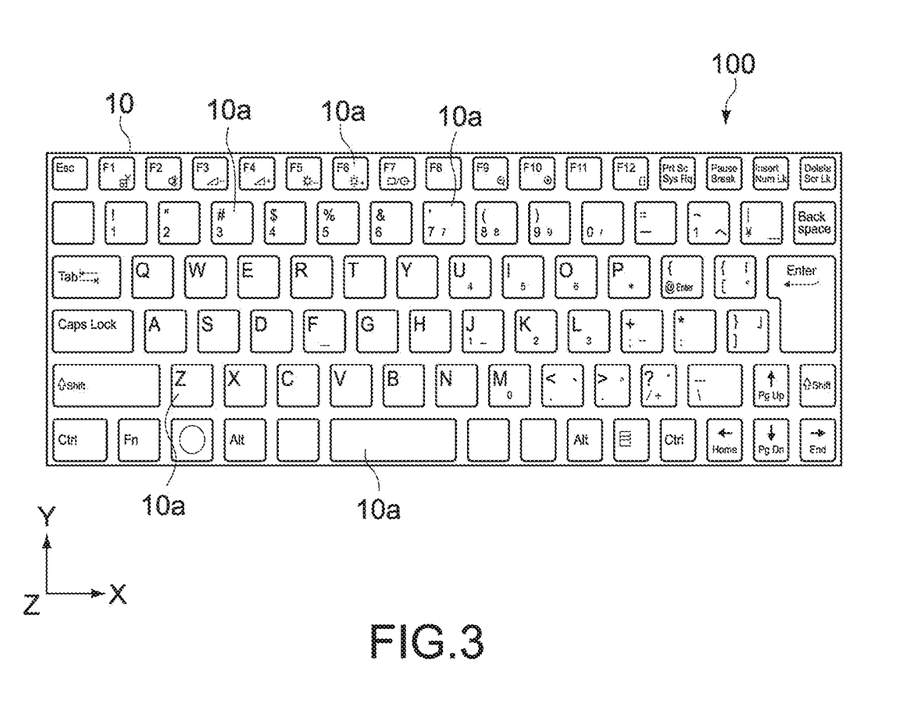
FIG. 3 is a plan view showing an operation surface of the keyboard module.
Figure 4:
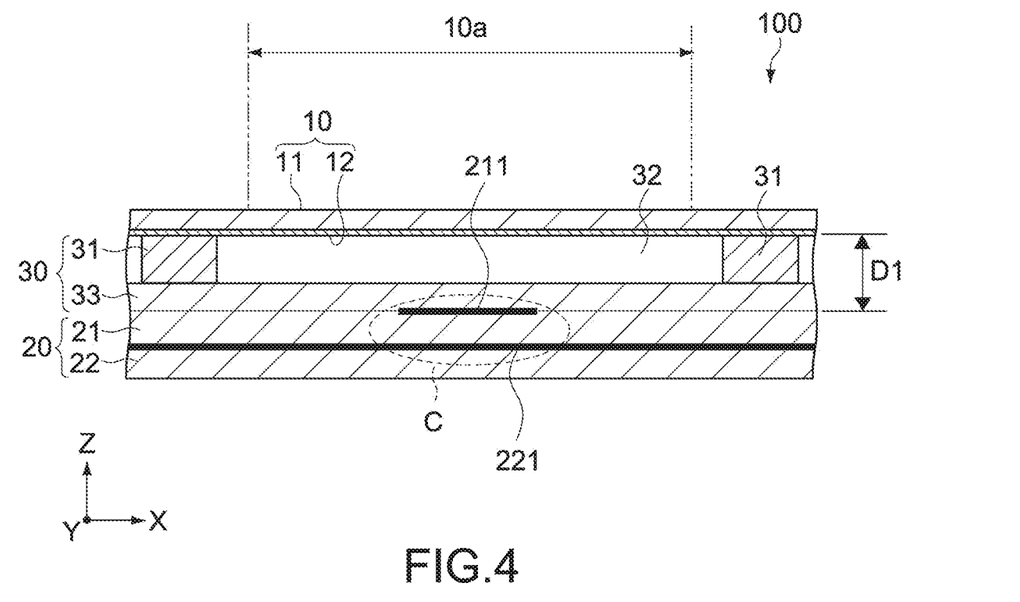
FIG. 4 is a partly enlarged cross-sectional view showing a part corresponding to a key area group of the keyboard module.
Figure 5:
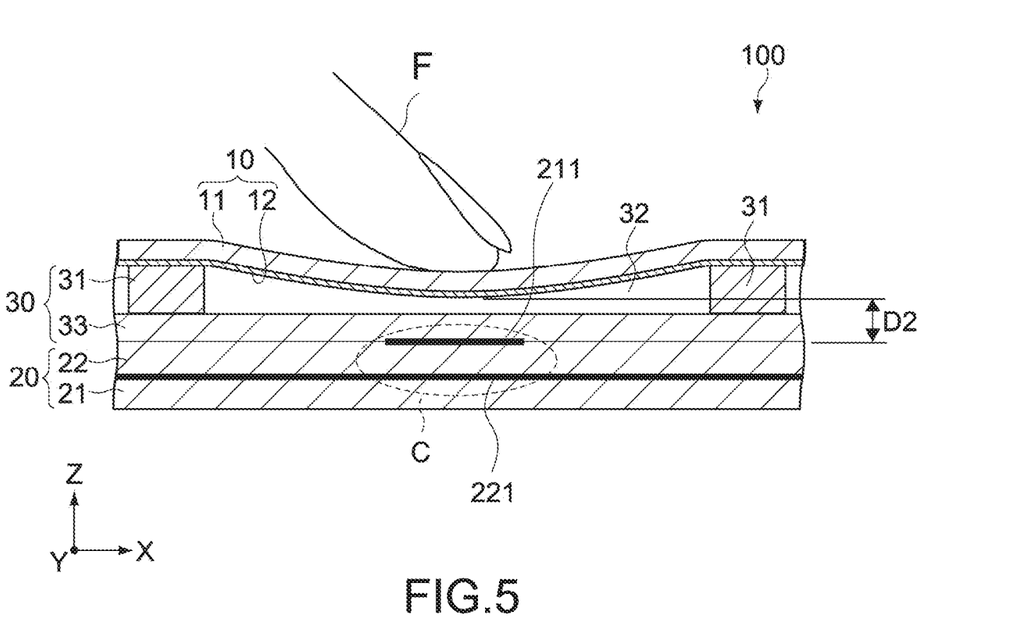
FIG. 5 is an enlarged cross-sectional view showing a state that a pressure is applied by a user's finger to any key area of the keyboard module.

FIG. 2 is a schematic cross-sectional view showing the keyboard module 100, and FIG. 3 is a plan view showing the keyboard module 100. FIG. 4 is a partly enlarged cross-sectional view showing a part of a key area group of the keyboard module 100, and FIG. 5 is a partly enlarged cross-sectional view for illustrating one action of the keyboard module 100.

Note that the X axis and the Y axis represent plane directions orthogonal to each other (in-plane directions of the keyboard module 100), and the Z axis represents the direction orthogonal to the X axis and the Y axis (a thickness direction of the keyboard module 100) in the drawings.

The keyboard module 100 has an operation member 10, an electrode board 20, and a support 30.

The operation member 10 includes the plurality of key areas 10a arranged in a matrix along the X axis direction and the Y axis direction. The operation member 10 has a laminated structure including a base 11 and a conductor layer 12. As shown in FIG. 5, the operation member 10 is constituted to be elastically deformed in the Z axis direction in response to the magnitude of the pressure applied from above by a finger F of the user or the like. The conductor layer 12 is connected to, for example, a ground potential, and is arranged at a rear surface of the base 11 facing to the electrode board 20.

The support 30 is arranged between the operation member 10 and the electrode board 20, and supports the operation member 10 to the electrode board 20 in an elastically deformable way. The support 30 includes a plurality of structures 31, spaces 32 among the plurality of structures 31, and a support layer 33 that supports the plurality of structures 31. The plurality of structures 31 are constituted of an elastically deformable material, and are arranged between a lower surface of the conductor layer 12 of the operation member 10 and an upper surface of the support layer 33. The support layer 33 is constituted of a flexible plastic film arranged on the upper surface of the electrode board 20.

Figure 6:
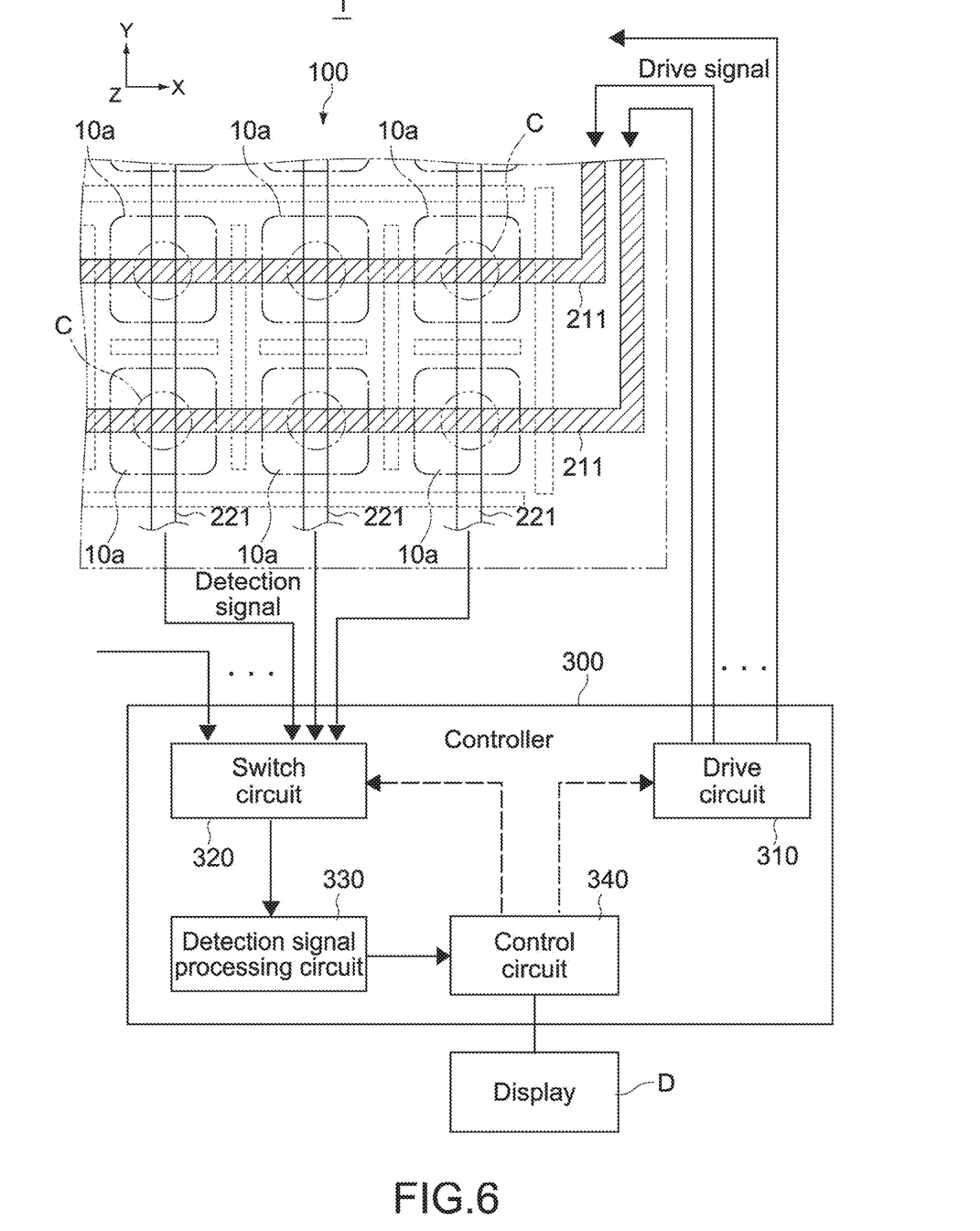
FIG. 6 is a schematic plan view showing a main part of the configuration of the electrode board of the keyboard module.

FIG. 6 is a schematic plan view showing a main part of the configuration of the electrode board 20 viewed in the Z axis direction. As shown in FIG. 4 to FIG. 6, the electrode board 20 has a laminated structure including a first wiring board 21 and a second wiring board 22.

The first wiring board 21 includes a plurality of drive electrodes 211 spaced apart from each other in the Y axis direction, to which a drive signal is applied from the controller 300. On the other hand, the second wiring board 22 includes a plurality of detection electrodes 221 spaced apart from each other in the X axis direction. The plurality of drive electrodes 211 and the plurality of detection electrodes 221 are arranged intersecting each other in a matrix pattern. At each intersection of the drive electrode 211 and the detection electrode 221, each capacitive element C (FIG. 4 and FIG. 5), which configures a mutual capacitance type electrostatic capacitance sensor, is formed by facing the drive electrode 211 and the detection electrode 221 via an insulation material base of the first wiring board 21. In a case where an alternate current or pulse drive voltage (drive signal) is applied to the drive electrode 211, the drive signal flows to the detection electrode 221 via the capacitive element C, and a detection voltage corresponding to electrostatic capacitance of the capacitive element C is provided.

The capacitive element C has preset initial capacitance. The initial capacitance of the capacitive element C is given by a relationship among the conductor layer 12, the drive electrode 211, and the detection electrode 221. As shown in FIG. 4 and FIG. 5, in a case where the operation member 10 is pressed by the finger F of the user or the like, and the distance between the conductor layer 12 of the operation member 10 and the drive electrode 211 in the Z axis direction is decreased from D1 to D2, the electrostatic capacitance of the capacitive element C is changed (increased) from the initial capacitance for the decreased distance D. The amount of change of the electrostatic capacitance is detected as changed information about the electrostatic capacitance of the capacitive element C in the controller 300 from the detection voltage provided through the detection electrode 221.

(Controller)

As shown in FIG. 1 and FIG. 6, the controller 300 includes a drive circuit 310, a switch circuit 320, a detection signal processing unit 330, and a control circuit 340.

The drive circuit 310 is a circuit that time-divisionally feeds the drive signal to each drive electrode 211 of the keyboard module 100 for one row.

The switch circuit 320 is a switch that time-divisionally switches each detection electrode 221 of the keyboard module 100 to the detection signal processing unit 330 for one column.

The detection signal processing circuit 330 amplifies the detection signal of the detection electrode 221 selected by the switch circuit 320, A/D converts the amplified signal, and feeds the converted signal to the control circuit 340. The detection signal processing circuit 330 can change an amplification gain by a control command from the control circuit 340.

The control circuit 340 includes a control circuit such as a CPU, an MPU, or an Application Specific IC, and memories such as a ROM and a RAM. The memory stores programs executable by the control circuit 340 and a variety of information used during the execution of the programs. The information stored on the memory includes a variety of parameters of processing relating to the keystroke operation.

The control circuit 340 controls the input apparatus 1 by executing the programs stored in the memory. Specifically,
1. Control of drive circuit 310
2. Control of switch circuit 320
3. Calculation of amount of change from initial capacitance of capacitive element C
4. Determination of whether or not keystroke operation is done by comparing amount of change with threshold value for keystroke determination
5. Adjustment of input sensitivity to keystroke operation The adjustment of the input sensitivity to the keystroke operation includes to make a difference between input sensitivity of one key area and input sensitivity of another key area. A method of adjusting the input sensitivity includes
5-1. Method of adjusting threshold value for keystroke determination,
5-2. Method of adjusting gain of amplification circuit, and the like.

Figure 7:
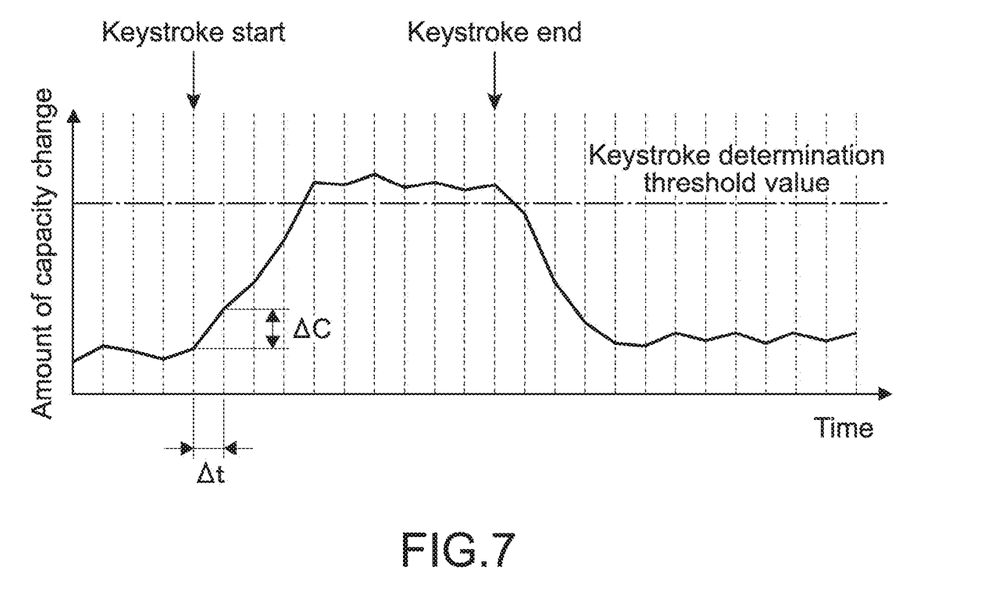
FIG. 7 is a diagram showing a transition of the amount of change by a keystroke operation of a capacitive element configuring the keyboard module.

FIG. 7 is a diagram showing a transition of the amount of change by the keystroke operation from the initial capacitance of the capacitive element C.

The control circuit 340 calculates the amount of change of the capacitive element C from an initial value of the electrostatic capacitance (hereinafter also referred to as an amount of capacity change) on the basis of the amount of change of the detection voltage of the detection electrode 221.

As shown in FIG. 5, in a case where a pressure is applied to any key area 10a of the keyboard module 100 by the user's finger or the like, a portion corresponding to the key area 10a of the operation member 10 is flexed (is displaced) in the Z axis direction for the amount corresponding to the magnitude of the applied pressure. As the distance between the conductor layer 12 of the operation member 10 and the drive electrode 211 in the Z axis direction is decreased, the amount of capacity change of the capacitive element C is increased, as shown in FIG. 7. In other words, in the keyboard module 100, the magnitude of the pressure applied to the key area 10a by the user is acquired as the amount of capacity change of the capacitive element C. Thereafter, when the pressure applied to the operation member 10 by the user is released and the distance between the conductor layer 12 of the operation member 10 and the drive electrode 211 in the Z axis direction has the original length again, the amount of capacity change of the capacitive element C is decreased. Note that the amount of change before and after the keystroke operation by the user in FIG. 7 is generated by noise components.

Typically, in a case where an input threshold value (keystroke determination threshold value in FIG. 7) adjusted equally or individually is set to each key and the pressure exceeding the threshold value is detected, the control circuit 340 outputs the signal corresponding to the key to the display unit D. The display unit D is electrically connected to the control circuit 340, and displays characters, symbols, and images such as graphics corresponding to the keystroke operation on the basis of the output from the control circuit 340.

In order to accurately detect the keystroke operation of each key, the plurality of capacitive elements C are arranged in a matrix pattern on an operation surface (XY plane) of the keyboard module 100. The arrangement form is not especially limited, and the capacitive elements C are arranged as shown in FIG. 8 and FIG. 9, for example.

Figure 8:
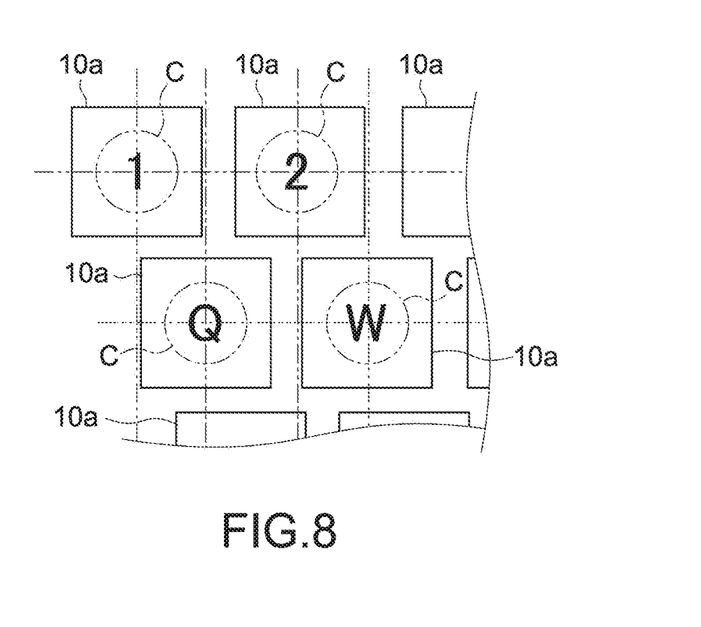
FIG. 8 is a schematic plan view showing a main part of the keyboard module that shows an arrangement example of the capacitive element.

FIG. 8 shows an example that the plurality of capacitive elements C are arranged corresponding to the center position of each key. In the arrangement example, the movements of the finger in the horizontal and vertical directions are detected by the discrete capacity change of each capacitive element C. In other words, in the arrangement example, the keystroke determination is typically executed on the basis of the amount of capacity change of each capacitive element C arranged corresponding to each key area 10a, similar to a pantograph type mechanical keyboard.

Figure 9:
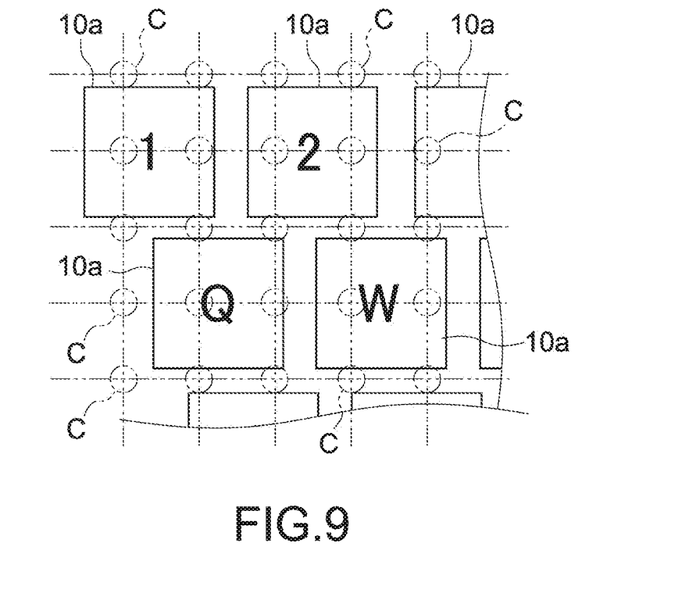
FIG. 9 is a schematic plan view showing a main part of the keyboard module that shows another arrangement example of the capacitive element.

On the other hand, FIG. 9 shows an example that the plurality of capacitive elements C are arranged in the horizontal and vertical directions at equal pitches irrespective of the key arrangement. In the arrangement example, the movements of the finger in the horizontal and vertical directions are detected by the nearly continuous capacity change between the capacitive elements. In other words, in the arrangement example, the plurality of capacitive elements C are distributed and arranged in one key area 10a and its surroundings, and the keystroke determination of each key is executed by a gravity center calculation on the basis of the amounts of capacity change of the plurality of capacitive elements C.

Here, there are problems that in a case where the operation surface is flat, it is difficult to find the positions of the keys, and in a case where the input position is inadequate such as the position between two keys next to each other, a weak keystroke is detected, and no key inputs are performed. On the other hand, in a case where typing is strong, the keys next to each other are detected at the same time, and unwanted characters may be input.

Therefore, in the input apparatus 1 of this embodiment, in order to reduce the incorrect inputs and improve the operability, the control circuit is configured as follows.

Namely, the control circuit 340 is configured to make a difference between the input sensitivity to the keystroke operation of one key area 10a and input sensitivity to the keystroke operation of other key area 10a next to the one key area on the basis of the pressure information item about each of the key areas 10a next to each other, the pressure information item being detected by the keystroke operation on the plurality of sensor devices (capacitive elements C) at the same time. In the input apparatus 1 including the control circuit 340, it is possible to facilitate the key inputs and preferentially input the keys having high probabilities that match the user's intention. With this configuration, it is possible to reduce the incorrect inputs and improve the operability.

Specifically, the control circuit 340 is configured to make the input sensitivity of one key area having the largest pressure detected among the key areas next to each other higher than the input sensitivity of the other. In this embodiment, as shown in FIG. 10, in a case where the position between two key areas 10a next to each other are pressed, the control circuit 340 adjusts the input sensitivity to the keystroke operation by following the process flow shown in FIG. 11.

Figure 10:
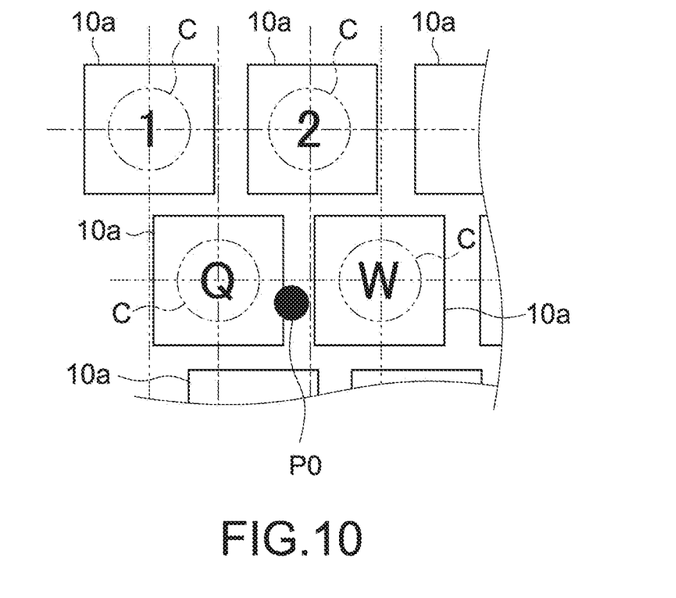
FIG. 10 is a schematic plan view showing a schematic plan view showing a main part of the state that the keystroke operation is performed between key areas next to each other of the keyboard module.
Figure 11:
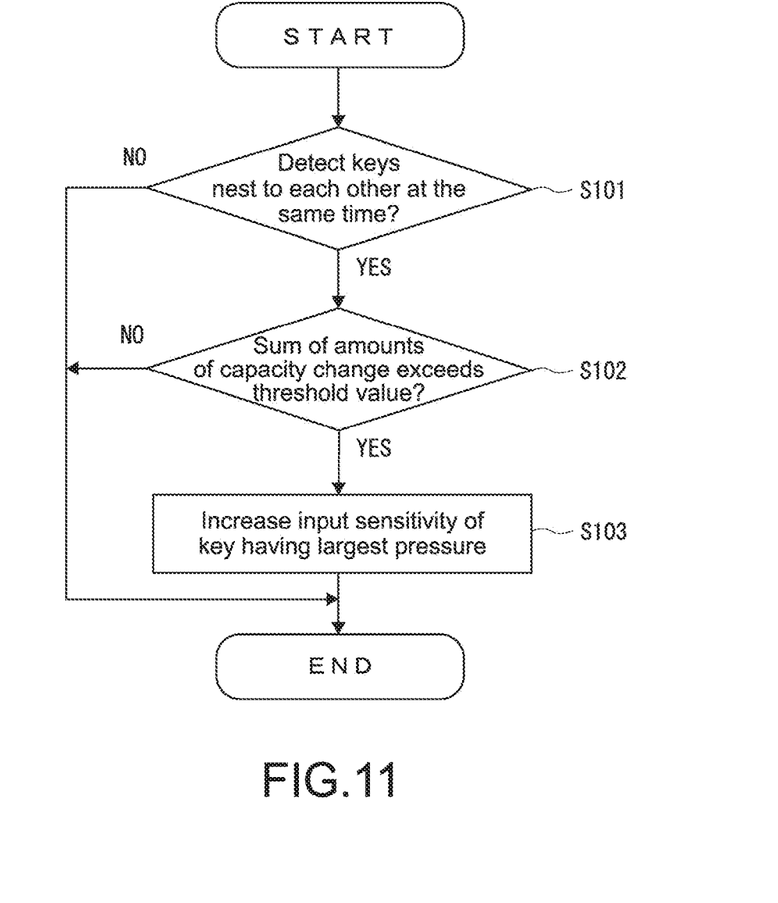
FIG. 11 is a diagram showing a control flow executed in the input apparatus when the keystroke operation is performed between the key areas next to each other.
Figure 12:
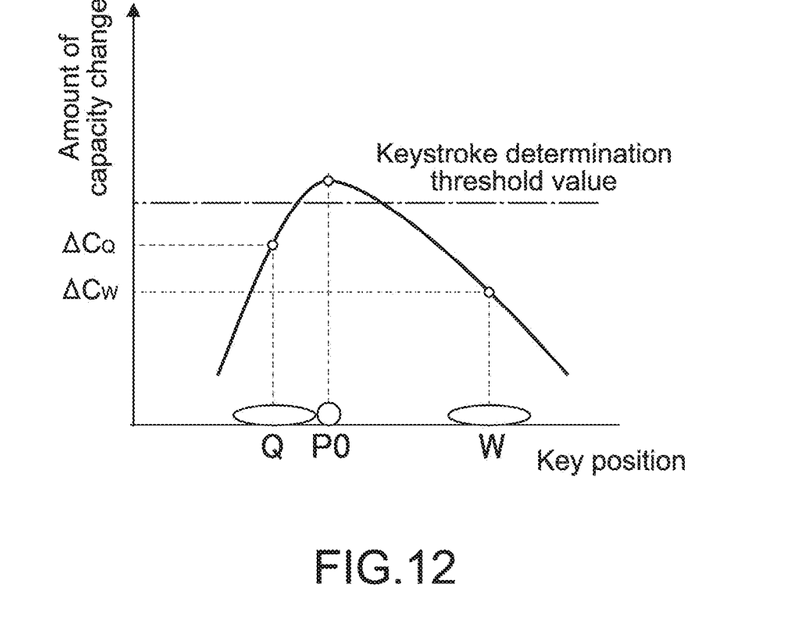
FIG. 12 is a diagram showing a detection example of the amount of capacity change of each key area when the keystroke operation is performed between the key areas next to each other.

As shown in FIG. 10, in a case where a point P0 between the two key areas 10a next to each other, "Q" and "W", is pressed, for example, the pressure acts on both of the two key areas 10a, "Q" and "W". As shown in FIG. 12, the control circuit 340 detects a predetermined amount or more of capacity change (pressure) $\Delta C_Q$ of the capacitive element C in the "Q" key area 10a and a predetermined amount or more of capacity change (pressure) $\Delta C_W$ of the capacitive element C in the "W" key area 10a at the same time (Step 101).

Here, "detects at the same time" means that "detects that the pressure acts on the plurality of key areas 10a by one keystroke operation", and includes not always the case that the amounts are detected at the same time, but the case that the amounts are chronologically detected.

In addition, "a predetermined amount or more of capacity change" means that the amount of capacity change when it is estimated that the position between two key areas next to each other are keystroked, and typically has a value greater than the amount of capacity change that can be detected in one key area next to another key area at the time of stroking the center of another key.

The amount of capacity change of each key area 10a can be determined on the basis of the point that maximum sensitivity is detected for a pressure distribution at a certain time, and the pressure distribution of the key area positioned near the point where the maximum sensitivity is detected, for example.

Next, the control circuit 340 determines whether or not the sum of $\Delta C_Q$ and $\Delta C_W$ exceeds the keystroke determination threshold value. If the sum is the keystroke determination threshold value or less, the input is invalid and the control circuit 340 ends keystroke determination processing (Step 102). The keystroke determination threshold value is typically set as the pressure for determining the validity of the keystroke operation to the single key area 10a. Thus, in a case where the sum of the amounts of capacity change of the plurality of key areas 10a where the keystroke operation is detected does not exceed the keystroke determination threshold value, by invalidating the keystroke operation, it is possible to inhibit the incorrect inputs at the time of preparing the keystroke operation such as moving the finger to search for a key.

On the other hand, if the control circuit 340 determines that the sum of $\Delta C_Q$ and $\Delta C_W$ exceeds the keystroke determination threshold value, the control circuit 340 performs the processing of making the input sensitivity of one key area having the largest pressure detected from the two key areas 10a, "Q" and "W", higher than the input sensitivity of the other (Step 103). For example, as shown in FIG. 12, in a case where the capacity change $\Delta C_Q$ is greater than the capacity change $\Delta C_W$, the input sensitivity of the input key 10a, "Q", is higher than the input sensitivity of the input key 10a, "W". As a result, the control circuit 340 determines that the keystroke operation is performed on the key area 10a, "Q", and outputs images relating to the "Q" key (typically, text information) to the display unit D.

Figure 13:
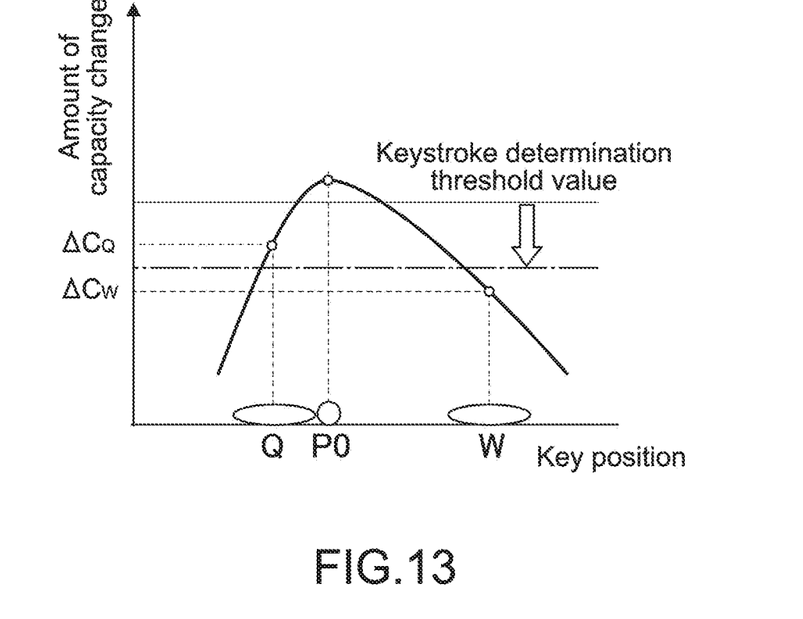
FIG. 13 is a diagram illustrating the state that the input sensitivity of one key area is increased by executing the control flow of FIG. 11.

The method of adjusting the input sensitivity is not especially limited. For example, as shown in FIG. 13, the processing of resetting the keystroke determination threshold value to any value between $\Delta C_Q$ and $\Delta C_W$ may be performed. Alternatively, the processing of increasing detection sensitivity (gain) of the key area 10a, "Q" out of "Q" and "W", higher than that of "W" may be performed.

As described above, since the key having the highest operation pressure is input in preference to other keys, it may avoid inputting of unwanted characters even if the keys next to each other are pressed by mistake. In addition, the key having the highest operation pressure has high probability that matches the key, to which input is intended by the user. Therefore, by increasing the input sensitivity of the key having the highest operation pressure, the input operation that matches the user's intention can be provided. With this configuration, it is possible to reduce the incorrect inputs and improve the operability.

According to the input apparatus 1 of this embodiment, in a thin keyboard with which small strokes are obtained, by determining whether or not preparing the keystroke operation is done before keystroking and by extracting the features of the keystroking, possible incorrect inputs (typing mistakes) by the user are decreased. For example, the following actions and effects are provided.

According to this embodiment, as described above, even if the keystroking is performed at an incorrect position not directly above the key, the key intended by the user can be output. In addition, by optimizing the input sensitivity by the control circuit 340, even if a keystroke pressure is insufficient, adequate key input determination can be executed. Furthermore, since the key having the highest keystroke pressure is preferentially selected, even if a keystroke operation is performed strong enough to generate the capacity change across the key areas next to the stroked key, it is possible to output only the key having the high probability that matches the user's intention.

Second Embodiment

Figure 14:
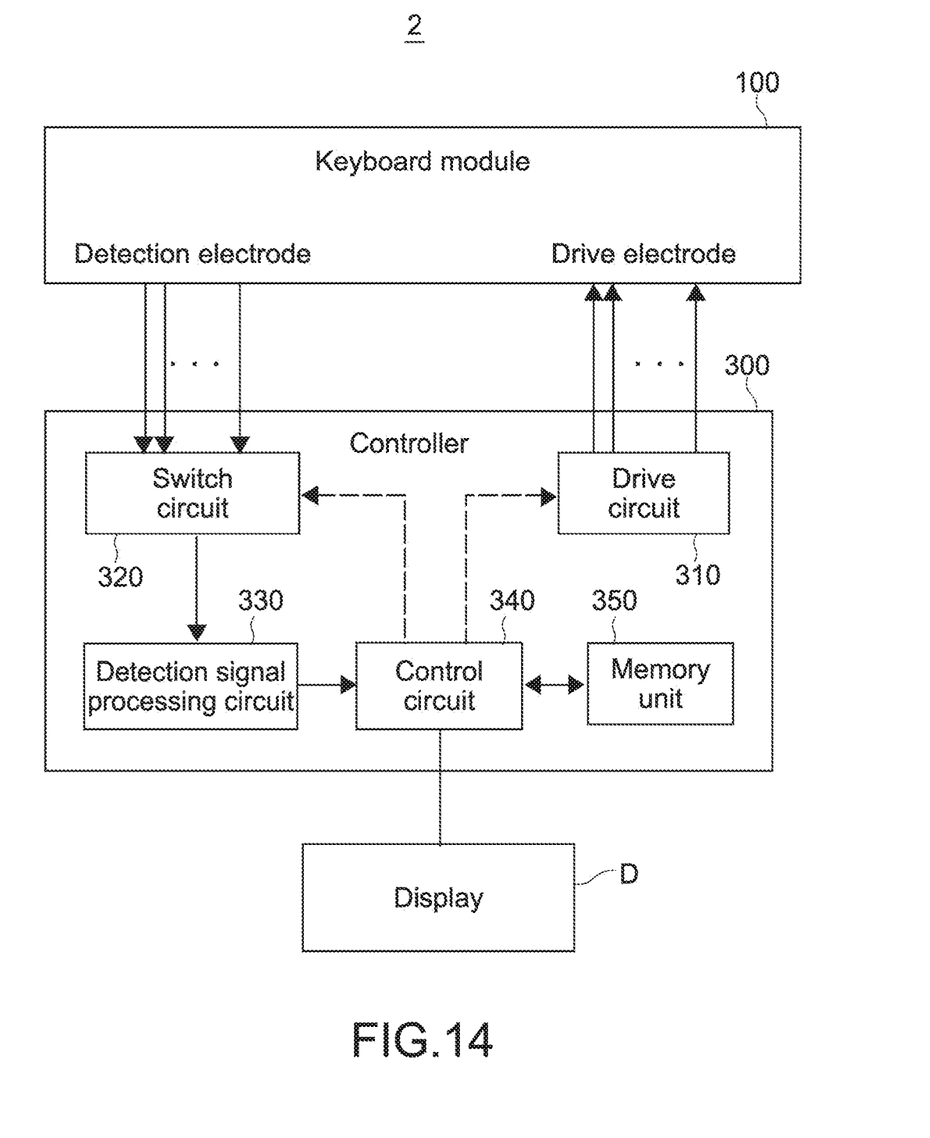
FIG. 14 is a block diagram showing a configuration of an input apparatus according to a second embodiment of the present technology.

FIG. 14 is a block diagram showing a configuration of an input apparatus according to a second embodiment of the present technology. Hereinafter, configurations different from the first embodiment will be mainly described. Configurations similar to the above-described embodiment are denoted by the similar reference signs, and description thereof will be omitted or simplified.

An input apparatus 2 of this embodiment includes a keyboard module 100 and a controller 300. In this embodiment, the controller 300 is different from the first embodiment in that the controller 300 includes a memory unit 350 having a dictionary function or the like.

The memory unit 350 is typically constituted of a rewritable non-volatile memory. The memory unit 350 stores key combination information constituting a plurality types of significant text strings such as English words (hereinafter referred to as word registration information). Furthermore, the memory unit 350 is configured to be capable of storing or updating operation information or the like inherent to the user such as an input history of a keystroke operation, e.g., a keystroke frequency and a pressure distribution in a key when a correct input or an incorrect input is performed.

Figure 15:
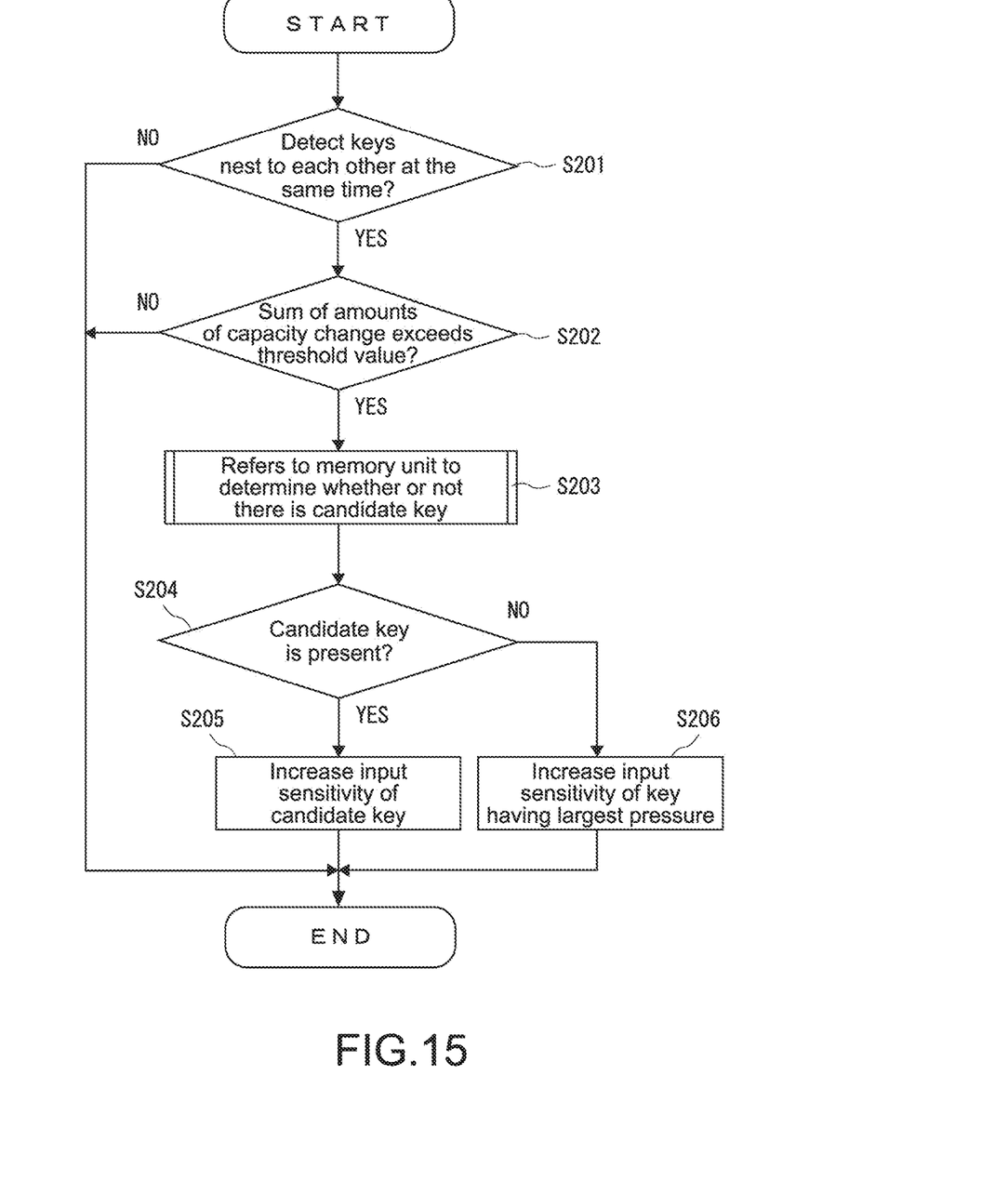
FIG. 15 is a diagram showing a control flow executed in the input apparatus when the keystroke operation is performed between the key areas next to each other.

The control circuit 340 is configured to make a difference between the input sensitivity to the keystroke operation of one key area 10a and the input sensitivity to the keystroke operation of the other key area 10a next to the one key area on the basis of the pressure information item about each of the key areas 10a next to each other, the pressure information item being detected by the keystroke operation at the same time, similar to the first embodiment. In particular, in this embodiment, the control circuit 340 is configured to make a difference between the input sensitivity of one key area and the input sensitivity of the other key area next to the one key area on the basis of the pressure information item (amount of capacity change) of each of one key area and the other key area and a variety of information stored in the memory unit 350. An example of the control flow is shown in FIG. 15.

If the control circuit 340 detects the predetermined amount or more of the capacity change of the capacitive element C in each of the key areas next to each other at the same time by performing the keystroke operation on the position between the key areas next to each other, similar to the first embodiment, the control circuit 340 determines whether or not the sum of the amounts of capacity change of the respective key areas exceeds the keystroke determination threshold value. If the sum is the keystroke determination threshold value or less, the input is invalid and the control circuit 340 ends keystroke determination processing (Steps 201 and 202).

On the other hand, if the control circuit 340 determines that the sum of the amounts of capacity change of the respective key areas exceeds the keystroke determination threshold value, the control circuit 340 refers to the memory unit 350 and executes processing of determining whether or not there is a candidate key (Step 203). Here, on the basis of the key information items input by the previous keystroke operations and the word registration information stored in the memory unit 350, the control circuit 340 determines that "a candidate keys is present" if a character corresponding to one of the plurality of key areas detected by the current keystroke operation is included, and determines that the "a candidate key is absent" if a character is not included.

For example, if the keys are input in the order of "k" and "e", the control circuit 340 predicts words such as "keep" and "key" on the basis of the word registration information, and determines whether or not there is a candidate key such as "y" and "e" in the plurality of keys where the predetermined amounts or more of capacity change are detected.

As a result, if the control circuit 340 determines that "a candidate key is present", it is expected that the key input next is highly likely to be the candidate key, the control circuit 340 executes processing of making the candidate key of the key area being the candidate key higher than that of other key area (Steps 204 and 205). As the processing of increasing the input sensitivity of the candidate key, for example, the input threshold value of the candidate key is set lower than the input threshold value of the other key.

By executing the processing as described above, the provability of the typing mistakes is decreased and the operability is improved. In addition, in a case where the pressure applied to the candidate key is smaller than that applied to the other key, the candidate key is preferentially selected. It is thus possible to rightly correct the incorrect inputs. Thus, since it is possible to predict the text string that the user tries to input, even if the keys next to each other are pressed by mistake at the same time during the operation, it is possible to preferentially input the keys having high probabilities that match the user's intention.

On the other hand, if the control circuit 340 determines that "a candidate key is absent", the control circuit 340 executes the processing of making the input sensitivity of one key area having the largest pressure higher than the input sensitivity of the other key area similar to the first embodiment (Steps 204 and 206). In this manner, the input operation that matches the user's intention can be provided.

Alternatively, if the control circuit 340 determines that "a candidate key is absent", the control circuit 340 may execute the processing of selecting the key being more likely to be the candidate key from the plurality of keys where the predetermined amounts or more of capacity change are detected, and increase the input sensitivity of the key on the basis of keystroke frequency information stored in the memory unit 350. In this case, as the text string not included in the word registration information but having a high input frequently is preferentially selected, typing mistakes can be reduced. In this manner, as the key frequently used is input preferentially to the other key, it may avoid inputting of unwanted characters even if the keys next to each other are pressed at the same time by mistake.

The control circuit 340 may determine whether or not a candidate key is present by referring to the word registration information as a base, the keystroke frequency information as a base, or the both as bases. In addition, the control circuit 340 may execute processing of including the text string into the word registration information when the keystroke frequency reaches the predetermined times or more.

As described above, the actions and effects are also provided in this embodiment similar to the first embodiment. In particular, according to this embodiment, since the control circuit 340 can predict input text string on the basis of the user's keystroke operation, the provability of the typing mistakes is more decreased.

The embodiments of present technology are described above, the present technology is not limited to the above-described embodiments, and it should be appreciated that various modifications and alterations may be added.

For example, in the respective above-described embodiments, the state that the keystroke operation is performed between the two key areas next to each other is described, but it is not limited thereto. Even if the keystroke operation is performed among the three or more key areas, each of which is adjacent, the present technology is similarly applicable.

Also, the above-described second embodiment is configured to execute the processing of selecting a candidate key from the word registration information or the keystroke frequency information stored in the memory unit 350. In addition to the processing, it may be configured to execute processing of displaying the candidate key on the display unit D.

Furthermore, in the above-described respective embodiments, the keyboard module 100 is configured as a member separate from the display unit D. The keyboard module and the display unit may be integrally configured. In this case, the keyboard module is typically configured to as a software keyboard displayed on the display unit.

Moreover, in the above-described respective embodiments, the sensor device that detects the keystroke pressure is formed of the electrostatic capacitive element, but they are not limited thereto. For example, the sensor devices may be formed of resistive film system touch sensors that a resistance value is continuously changed depending on a pressure (contact area).

The present technology may also have the following configurations.

(1) An input apparatus, including:

a keyboard module having a plurality of key areas, and a plurality of sensor devices capable of detecting pressures of keystroke operations for the plurality of key areas, respectively; and a control circuit that makes a difference between input sensitivity to the keystroke operation of one key area and input sensitivity to the keystroke operation of a key area next to the one key area on the basis of a pressure information item about each of the key areas next to each other, the pressure information item being detected by the keystroke operation on the plurality of sensor devices at the same time.

(2) The input apparatus according to (1), in which the control circuit makes the input sensitivity of one key area having the largest pressure detected among the key areas next to each other higher than the input sensitivity of the other.

(3) The input apparatus according to (1) or (2), further including:

a memory unit that stores a plurality of key information items that represent a plurality of text strings and an input history of the keystroke operation, the control circuit making a difference between the input sensitivity to the keystroke operation of one key area and the input sensitivity to the keystroke operation of the key area next to the one key area on the basis of the pressure information item about each of the key areas next to each other, the plurality of key information items, and the input history.

(4) The input apparatus according to (1) or (2), further including:

a memory unit that stores the input history of the keystroke operation, the control circuit making a difference between the input sensitivity to the keystroke operation of one key area and the input sensitivity to the keystroke operation of the key area next to the one key area on the basis of the pressure information item about each of the key areas next to each other and the input history.

(5) The input apparatus according to any one of (1) to (4), in which the plurality of sensor devices are a plurality of capacitance sensors that detect the pressure of the keystroke operation as a change of capacitance.

(6) The input apparatus according to (5), in which the input sensitivity is a threshold value of an amount of capacity change set for each of the plurality of capacitance sensors.

(7) An information processing apparatus, including:

a keyboard module having a plurality of key areas, and a plurality of sensor devices capable of detecting pressures of keystroke operations for the plurality of key areas, respectively;

a control circuit that makes a difference between input sensitivity to the keystroke operation of one key area and input sensitivity to the keystroke operation of a key area next to the one key area on the basis of a pressure information item about each of the key areas next to each other, the pressure information item being detected by the keystroke operation on the plurality of sensor devices at the same time; and a display unit that displays an image corresponding to the keystroke operation on the basis of an output from the control circuit.

REFERENCE SIGNS LIST 1, 2 input apparatus
10 operation member
20 electrode board
30 support
100 keyboard module
300 controller
340 control circuit
350 memory unit
D display unit

The invention claimed is:

1. An input apparatus, comprising:
a keyboard module comprising:
   a plurality of key areas; and
   a plurality of sensor devices,
      wherein each sensor device of the plurality of sensor devices is configured to detect pressure of a keystroke operation of a respective key area of the plurality of key areas; and
a control circuit configured to:
   detect the keystroke operation at a position between a first key area of the plurality of key areas and a second key area of the plurality of key areas;
   detect a first pressure at the first key area based on the keystroke operation at the position between the first key area and the second key area;
   detect a second pressure at the second key area based on the keystroke operation at the position between the first key area and the second key area, wherein the first pressure and the second pressure are detected at a same time; and
   generate a difference between an input sensitivity of the keystroke operation of the first key area and an input sensitivity of the keystroke operation of the second key area, wherein
      the second key area is adjacent to the first key area, and
      the difference is generated based on the first pressure detected at the first key area and the second pressure detected at the second key area.

2. The input apparatus according to claim 1, wherein the control circuit is further configured to set the input sensitivity of the first key area higher than the input sensitivity of the second key area based on the first pressure of the first key area that is greater than the second pressure of the second key area.

3. The input apparatus according to claim 1, further comprising a memory unit configured to store a plurality of key information items and an input history of the keystroke operation, wherein
   the plurality of key information items represents a plurality of text strings, and
   the control circuit is further configured to set the difference between the input sensitivity of the first key area and the input sensitivity of the second key area based on the first pressure, the second pressure, the plurality of key information items, and the input history.

4. The input apparatus according to claim 1, further comprising a memory unit configured to store input history of the keystroke operation, wherein
   the control circuit is further configured to set the difference between the input sensitivity of the first key area and the input sensitivity of the second key area based on the first pressure, the second pressure, and the input history.

5. The input apparatus according to claim 1, wherein
   the plurality of sensor devices comprises a plurality of capacitance sensors configured to detect the pressure of the keystroke operation as a change of capacitance.

6. The input apparatus according to claim 5, wherein the input sensitivity is a first threshold value of an amount of capacitance change set for each capacitance sensor of the plurality of capacitance sensors.

7. An information processing apparatus, comprising:
a keyboard module comprising:
   a plurality of key areas; and
   a plurality of sensor devices,
      wherein each sensor device of the plurality of sensor devices is configured to detect pressure of a keystroke operation of a respective key area of the plurality of key areas;
a control circuit configured to:
   detect the keystroke operation at a position between a first key area of the plurality of key areas and a second key area of the plurality of key areas;
   detect a first pressure at the first key area based on the keystroke operation at the position between the first key area and the second key area;
   detect a second pressure at the second key area based on the keystroke operation at the position between the first key area and the second key area, wherein the first pressure and the second pressure are detected at a same time; and
   generate a difference between an input sensitivity of the keystroke operation of the first key area and an input sensitivity of the keystroke operation of the second key area, wherein
      the second key area is adjacent to the first key area, and
      the difference is generated based on the first pressure detected at the first key area and the second pressure detected at the second key area; and
a display unit configured to display an image corresponding to the keystroke operation based on an output from the control circuit.

8. The input apparatus according to claim 6, wherein the control circuit is further configured to:
   determine that a sum of the amount of the capacitance change of the plurality of key areas exceeds a second threshold value; and
   determine a validity of the keystroke operation based on the determination that the sum exceeds the second threshold value.

* * * * *